United States Patent
Haba

(10) Patent No.: US 9,553,071 B1
(45) Date of Patent: Jan. 24, 2017

(54) MULTI-CHIP PACKAGE WITH INTERCONNECTS EXTENDING THROUGH LOGIC CHIP

(71) Applicant: Invensas Corporation, San Jose, CA (US)

(72) Inventor: Belgacem Haba, Saratoga, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 14/992,178

(22) Filed: Jan. 11, 2016

(51) Int. Cl.
*H01L 25/065* (2006.01)

(52) U.S. Cl.
CPC . *H01L 25/0652* (2013.01); *H01L 2225/06513* (2013.01); *H01L 2225/06541* (2013.01); *H01L 2225/06562* (2013.01); *H01L 2225/06582* (2013.01); *H01L 2225/06589* (2013.01)

(58) Field of Classification Search
CPC ......... H01L 25/0652; H01L 2225/06562; H01L 2225/06513; H01L 2225/06589; H01L 2225/06541; H01L 2225/06582
See application file for complete search history.

(56) References Cited

U.S. PATENT DOCUMENTS

| | | | |
|---|---|---|---|
| 6,586,835 B1 * | 7/2003 | Ahn | G02B 6/4214 257/668 |
| 7,402,911 B2 * | 7/2008 | Thomas | H01L 23/3128 257/678 |

\* cited by examiner

*Primary Examiner* — David Vu
(74) *Attorney, Agent, or Firm* — Lerner, David, Littenberg, Krumholz & Mentlik, LLP

(57) ABSTRACT

A microelectronic package includes a first microelectronic element comprising logic circuitry which is flip-chip mounted to a substrate, the substrate having terminals for connection with a circuit panel or other external component. A second microelectronic element overlies a rear surface of the first microelectronic element and has contacts electrically coupled with the substrate through electrically conductive interconnects extending through a region of the first microelectronic element. A heat spreader is thermally coupled with the rear surface of the substrate, either directly or through an additional element overlying the rear surface. Additional contacts of the second microelectronic element may be coupled with contacts of the substrate through electrically conductive structure disposed beyond an edge surface of the first microelectronic element.

20 Claims, 4 Drawing Sheets

MULTI-CHIP PACKAGE WITH INTERCONNECTS EXTENDING THROUGH LOGIC CHIP

BACKGROUND OF THE INVENTION

Field of the Invention

The subject matter of this application relates to microelectronic packages which comprise both logic and memory die and more particularly to packages in which enhanced heat transfer is provided.

Description of the Related Art

Semiconductor die or chips are flat bodies with contacts disposed on the front surface that are connected to the internal electrical circuitry of the chip itself. Semiconductor chips are typically packaged with substrates to form microelectronic packages having terminals that are electrically connected to the chip contacts. The package may then be connected to test equipment to determine whether the packaged device conforms to a desired performance standard. Once tested, the package may be connected to a larger circuit, e.g., a circuit in an electronic product such as a computer or a cell phone.

In order to save space certain conventional designs have stacked multiple microelectronic elements or semiconductor chips within a package. This allows the package to occupy a surface area on a substrate that is less than the total surface area of the chips in the stack. However, conventional stacked packages have disadvantages of complexity, cost, thickness and testability.

Microelectronic elements of different types can be combined within the same package to provide faster and higher bandwidth connections between them. Combining semiconductor chips which have logic circuitry thereon with other types of chips can pose particular challenges. High bandwidth logic circuitry may require that connections between the logic chip and the substrate be in large numbers and as short as possible, favoring a flip-chip connection between the logic chip and the substrate. Chips within the package which implement other functions can be placed at other positions in the package so as not to interfere with the high bandwidth requirements of the logic chip. However, logic chips can generate much heat which needs to be shed to permit proper operation. Heat transfer from the logic chip to the outside can be impeded when another chip in the assembly substantially or completely covers an area of the logic chip, and can be further impeded when the another chip in the package is also operating, such that that heat is an even greater challenge to address.

For example, as seen in FIG. 1, in a prior art assembly including a microelectronic package 10, a logic chip 12 is flip-chip mounted to a substrate 14 in the microelectronic package, and the package 10 in turn is surface mounted to a circuit panel 20, such as through a ball grid array 22. As further seen in FIG. 1, another component 30 such as a chip or packaged chip of a different type than the logic chip 12 can be positioned above the logic chip 12 and electrically interconnected with the package 10, either through circuitry internal to or external to the package 10. Component 30 is provided within the same or a different microelectronic package as the logic chip. Lower bandwidth connections may be provided between the other component 30 and the substrate 14 than as provided between the logic chip 12 and the substrate 14. The assembly may be additionally coupled with a heat spreader 32 as seen in FIG. 1 or other component disposed above the component 30.

The assembly shown in FIG. 1 faces a particular challenge in shedding heat from the logic chip 12. The presence of the other component 30 can impede the transfer of heat to the heat spreader 32 as it may not be a very good thermal conductor, and the heat generated within the other component 30 may decrease the heat gradient between the logic chip 14 and the heat spreader 32, causing the rate of heat transfer between them to decrease. Excessive heat can decrease the performance of chips in a microelectronic package and can impact short term operation and long-term reliability.

In light of the foregoing, it would be desirable to provide a multi-chip microelectronic package which has features which facilitate high bandwidth connections between a logic chip and a substrate, and permit another type of chip to be positioned within the package and interconnected with the logic chip without sacrificing the thermal performance of the package.

Size is a significant consideration in any physical arrangement of chips. The demand for more compact physical arrangements of chips has become even more intense with the rapid progress of portable electronic devices. Merely by way of example, devices commonly referred to as "smart phones" integrate the functions of a cellular telephone with powerful data processors, memory and ancillary devices such as global positioning system receivers, electronic cameras, and local area network connections along with high-resolution displays and associated image processing chips. Such devices can provide capabilities such as full internet connectivity, entertainment including full-resolution video, navigation, electronic banking and more, all in a pocket-size device. Complex portable devices require packing numerous chips into a small space. Moreover, some of the chips have many input and output connections, commonly referred to as "I/Os." These I/Os must be interconnected with the I/Os of other chips. The components which form the interconnections should not greatly increase the size of the assembly. Similar needs arise in other applications as, for example, in data servers such as those used in internet search engines where increased performance and size reduction are needed.

Semiconductor chips are commonly packaged in single- or multiple-chip packages and assemblies. Each package has many electrical connections for carrying signals, power and ground between terminals and the chips therein. The electrical connections can include different kinds of conductors such as horizontal conductors, e.g., traces, beam leads, etc., which extend in a horizontal direction relative to a contact-bearing surface of a chip, vertical conductors such as vias, which extend in a vertical direction relative to the surface of the chip, and wire bonds which extend in both horizontal and vertical directions relative to the surface of the chip.

As manufacturers of smartphones, tablets and other devices constantly seek increased performance and greater circuit density the trend for these devices is to provide ever greater functional capabilities in an amount of space on a circuit panel that may stay the same or decrease over time. In light of the foregoing, certain improvements can be made in the structure of microelectronic packages and assemblies which comprise a microelectronic package.

In spite of the above advances, there remains a need for improved multi-chip packages and especially multi-chip packages which incorporate a logic chip and another type of chip such as dynamic random access memory ("DRAM") chip which provide high logic bandwidth and improved thermal characteristics.

BRIEF SUMMARY OF THE INVENTION

In accordance with an aspect of the invention, a microelectronic package is provided which can comprise a substrate having first and second oppositely-facing surfaces, with a plurality of substrate contacts at the first surface. A plurality of terminals may be provided at the second surface. The package may include a first microelectronic element having a front surface and first contacts at its front surface, a rear surface opposite the front surface, a semiconductor region between the front and rear surfaces, and electrically conductive interconnects extending through the semiconductor region in a direction from the rear surface to the front surface. The first contacts may face and be joined with the substrate contacts. A second microelectronic element having a front surface and second contacts at its front surface may be positioned to at least partially overlie the rear surface of the first microelectronic element. The second contacts may be electrically coupled with the substrate contacts through the interconnects. In one embodiment, a portion of the area of the rear surface of the first microelectronic element is uncovered by the second microelectronic element. In one embodiment, the uncovered portion is at least one third of the area of the rear surface.

In accordance with one or more particular aspects of the invention, the first microelectronic element may have an edge surface extending between its front surface and the rear surface, wherein a portion of the second microelectronic element extends in a lateral direction parallel to the rear surface beyond the edge surface of the first microelectronic element.

In accordance with one or more particular aspects of the invention, the first microelectronic element may comprise logic circuitry and the second microelectronic element may comprise a memory storage array, wherein the first and second microelectronic elements can be coupled with one another such that the first microelectronic element can be configured to post read commands to the second microelectronic element and to receive information retrieved from the memory storage array, and can be configured to post write commands to the second microelectronic element and to cause information to be written to the memory storage array.

In accordance with one or more particular aspects of the invention, the second contacts at a portion of the front surface of the second microelectronic element extending beyond the edge surface of the first microelectronic element can be electrically coupled with the substrate contacts through electrically conductive structure disposed entirely beyond the edge surface of the first microelectronic element. In accordance with one or more particular aspects of the invention, the electrically conductive structure may have a different pitch or pattern of contacts where connection is made with the substrate, than where connection is made with the second microelectronic element.

In accordance with one or more particular aspects of the invention, the package may additionally or alternatively comprise a component having a front surface facing the rear surface of the first microelectronic element, the component having contacts at a surface thereof facing the rear surface of first microelectronic element. The contacts of the component may be electrically coupled with the substrate contacts through interconnects which extend through the first microelectronic element.

In one embodiment, the component may be a third microelectronic element that has third contacts at its front surface facing the rear surface of first microelectronic element. The third contacts may be electrically coupled with the substrate contacts through the interconnects.

In certain implementations, the component may comprise plural discrete device components provided in a side-by-side or stacked arrangement, such as a vertically integrated stack of memory chips, sensors, etc.

In accordance with one or more particular aspects of the invention, the package may further comprise a heat spreader thermally coupled with the portion of the rear surface that is uncovered by the second microelectronic element. In one embodiment, the second microelectronic element may have a rear surface opposite its front surface, and a portion of the unitary thermally conductive element overlies the rear surface of the second microelectronic element and can be thermally coupled therewith. In a particular embodiment, the heat spreader comprises a unitary thermally conductive element thermally coupled with the portion of the area of the rear surface of first microelectronic element that can be uncovered by the second microelectronic element.

In accordance with one or more particular aspects of the invention, the package may further comprise an electrically insulating interconnection element disposed beyond the edge surface of the first microelectronic element supporting the second microelectronic element above the first surface of the substrate, wherein the electrically conductive structure extends through the interconnection element.

In accordance with one or more particular aspects of the invention, the electrically conductive structure may comprise at least one of substantially rigid metal posts, or extruded metal wire.

In accordance with one or more particular aspects of the invention, the interconnection element may comprise a region of at least one of glass or semiconductor material, and the electrically conductive structure can extend through the interconnection element.

In accordance with one or more particular aspects of the invention, the package may further comprise a spacer element comprising a unitary region of semiconductor material having surfaces parallel to first surface of the substrate and the front surface of the second microelectronic element, the spacer element mechanically coupling the substrate with the second microelectronic element.

In accordance with an aspect of the invention, a microelectronic package is provided which comprises a substrate having first and second oppositely-facing surfaces, a plurality of substrate contacts at the first surface. In one example, a plurality of terminals may be at the second surface. A first microelectronic element may consist essentially of logic circuitry, and having a front surface and first contacts at its front surface, a rear surface opposite the front surface, and an edge surface between the front and rear surfaces, and electrically conductive interconnects extending in a direction from the rear surface to the front surface, the first contacts facing and joined with the substrate contacts. A second microelectronic element may comprise a memory storage array, and have a front surface and second contacts at its front surface, wherein the front surface and the second contacts of the second microelectronic element partially overlie the rear surface of the first microelectronic element. The front surface of the second microelectronic element may extend outwardly beyond the edge surface of the first microelectronic element, and the second contacts can be electrically coupled with the substrate contacts through the interconnects. In one embodiment, the first and second microelectronic elements can be coupled with one another such that the first microelectronic element is configured to post read commands to the second microelectronic element and to receive information retrieved from the memory storage array. The first microelectronic element can be configured to post write commands to the second microelectronic element and to cause information to be written to the memory storage array. A portion of the area of the rear surface of the first microelectronic element may be uncovered by the second microelectronic element. In a particular embodiment, at least one third of the area of the rear surface of the first microelectronic element is uncovered by the second microelectronic element. The microelectronic package may further comprise a heat spreader thermally coupled with the portion of the rear surface uncovered by the second microelectronic element.

In accordance with one or more particular aspects of the invention, the second microelectronic element may have a rear surface opposite its front surface, and a portion of the unitary thermally conductive element overlies the rear surface of the second microelectronic element and can be thermally coupled therewith.

In accordance with one or more particular aspects of the invention, the package may further comprise an electrically insulating interconnection element disposed beyond the edge surface of the first microelectronic element supporting the second microelectronic element above the first surface of the substrate. In one embodiment, the electrically conductive structure extends through the interconnection element.

In accordance with one or more particular aspects of the invention, the second contacts at a portion of the front surface of the second microelectronic element can extend beyond the edge surface of the first microelectronic element and can be electrically coupled with the substrate contacts through electrically conductive structure disposed entirely beyond the edge surface of the first microelectronic element. In accordance with one or more particular aspects of the invention, the electrically conductive structure may have a different pitch or pattern of contacts where connection is made with the substrate, than where connection is made with the second microelectronic element.

In a particular embodiment. the electrically conductive structure may comprise substantially rigid metal posts.

In accordance with one or more particular aspects of the invention, the first microelectronic element may have a semiconductor region between the front and rear surfaces, and the electrically conductive interconnects extend through the semiconductor region.

A system in accordance with one or more particular aspects of the invention can comprise the microelectronic package and one or more other electronic components electrically coupled with the microelectronic package. In one embodiment, the system can further comprise a housing, and the microelectronic package and the one or more other electronic components being assembled with the housing.

DETAILED DESCRIPTION OF THE INVENTION

As used in this disclosure with reference to a dielectric region or a dielectric structure of a component, e.g., circuit structure, interposer, microelectronic element, capacitor, voltage regulator, circuit panel, substrate, etc., a statement that an electrically conductive element is "at" a surface of the dielectric region or component indicates that, when the surface is not covered or assembled with any other element, the electrically conductive element is available for contact with a theoretical point moving in a direction perpendicular to that surface of the dielectric region from outside the dielectric region or component. Thus, a terminal or other conductive element which is at a surface of a dielectric region may project from such surface; may be flush with such surface; or may be recessed relative to such surface in a hole or depression in the dielectric region.

Figure 1:
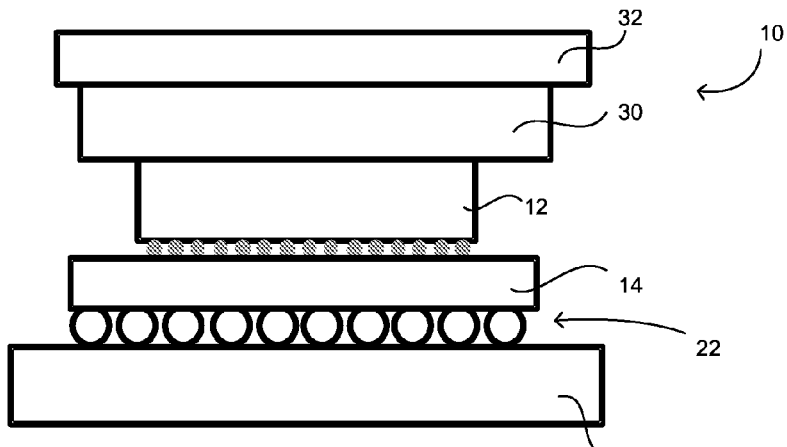
FIG. 1 is an elevational view depicting a prior art microelectronic assembly.
Figure 2:
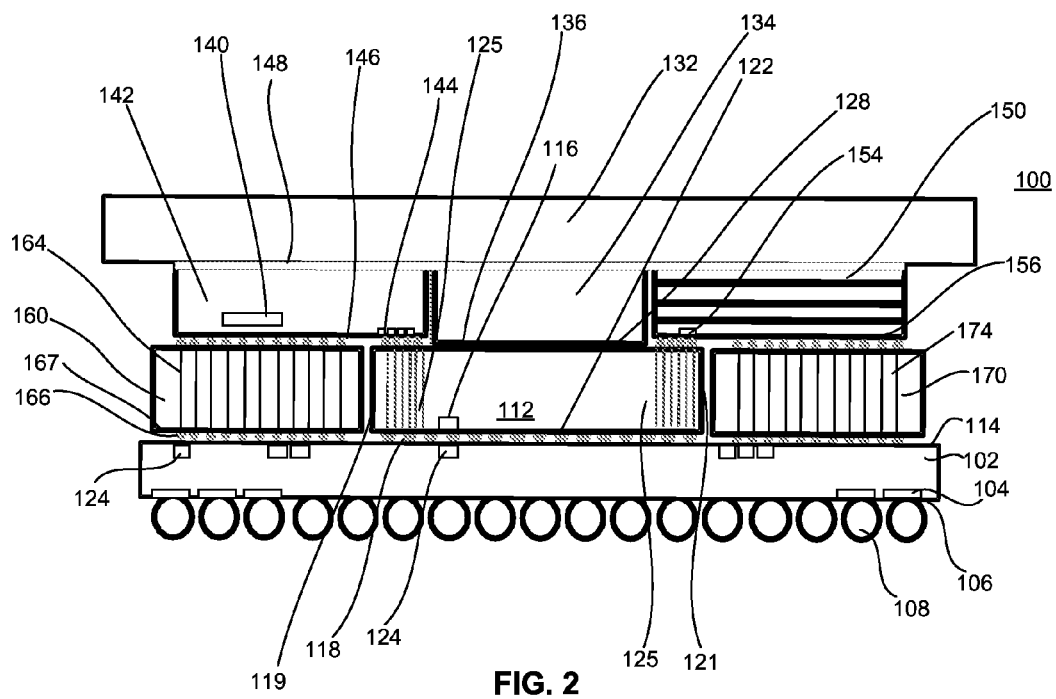
FIG. 2 is a sectional view depicting a microelectronic assembly in accordance with an embodiment of the invention.

A microelectronic package 100 according to an embodiment of the invention is illustrated in FIG. 2. As seen therein, the package includes a substrate 102, having terminals 104 at a major surface 106 of the package, for electrical connection with a circuit panel (not shown), such as, for example, through a ball grid array 108 or other electrically conductive masses. A first microelectronic element 112 is flip-chip mounted to a major surface 114 of the substrate 102, i.e., through bumps 118 of bonding material or other electrically material which electrically couple contacts 116 at a front surface 122 of the first microelectronic element with corresponding substrate contacts 124 at the major surface 114 of the substrate 102. The bonding material in the examples provided herein can be solder, tin, indium, gold, e.g., stud bumps, electrically conductive polymer material, e.g., metal particles or flakes in a polymer matrix, or a combination of the same. The first microelectronic element 112 has a plurality of electrically conductive interconnects 125 extending through the first microelectronic element in a direction from the rear surface 128 of the first microelectronic element towards the front surface 122 of the first microelectronic element. In one embodiment, the interconnects can extend through a semiconductor region disposed between the front and rear surfaces 122, 128 of the first microelectronic element, e.g., as through silicon vias of the first microelectronic element. In another embodiment, a molded dielectric region such as a molded encapsulation can be provided at peripheral edges of a semiconductor portion of the first microelectronic element 112, and the interconnects 125 can extend through the molded dielectric region disposed beyond the peripheral edges of the semiconductor region.

A second microelectronic element 142 is positioned in the package so that at least a portion of the second microelectronic element overlies the rear surface 128 of the first microelectronic element 112, and leaving a portion of the rear surface 128 uncovered by the second microelectronic element. In one embodiment, one third or more of a surface area of the rear surface 128 is uncovered by the second microelectronic element 142. As further seen in FIG. 2, a plurality of second contacts 144 at a front surface 146 of the second microelectronic element 112 are electrically coupled with the substrate contacts 124 through the interconnects 125 that extend through the first microelectronic element 112.

In one embodiment, the first microelectronic element comprises logic circuitry, which in some cases can be a processor. In specific embodiments, the first microelectronic element may comprise an application specific integrated circuit ("ASIC"), or a processor for a mobile device such as a smartphone, tablet computing device, phablet or other portable telecommunications or computing device (e.g., baseband processor, application processor, central processing unit (CPU), etc.). The second microelectronic element 142 can comprise a memory storage array 140. In specific embodiments, the second microelectronic element can comprise a dynamic random access memory ("DRAM"). In specific embodiments, logic circuitry or a processor within the first microelectronic element is configured to access a memory storage array within the second microelectronic element and to post read commands to the second microelectronic element to read data stored in the memory storage array, as well as to post write commands to the second microelectronic element to cause information to be written to the memory storage array. Thus, in such embodiment, the first microelectronic element is configured to post read commands to the second microelectronic element and to receive information that is retrieved from the memory storage array 140, and the first microelectronic element is configured to post write commands to the second microelectronic element and to cause information to be written to the memory storage array 140.

As also seen in FIG. 2, at a periphery of the first microelectronic element 112 an edge surface 119 extends between its front and rear surfaces 122, 128. The second microelectronic element 142 extends in a lateral direction parallel to the rear surface 128 to a position beyond the edge surface 119. The second microelectronic element may be further interconnected with the substrate through electrically conductive structure that is disposed entirely beyond the edge surface 119. In the example shown in FIG. 2, the electrically conductive structure can be electrically conductive interconnects 164 which extend through an interconnection element 160 disposed between the first surface 114 of the substrate and the front surface 146 of the first microelectronic element. In one embodiment, the interconnects 164 can be coupled with the substrate contacts 124 through bonding material 166 disposed between a surface 167 of the interconnection element 160 and the major surface 114 of the substrate 102 juxtaposed therewith.

In specific embodiments, the interconnection element may be an active or passive electronic component, or may be an interposer structure consisting essentially of electrically insulative material, which in some cases may be glass or a semiconductor region coated with a dielectric material. Alternatively, the interconnection element 160 can be made of or include a region of one or more of semiconductor material or electrically conductive material having an electrically insulative material thereon to prevent undesired electrical interactions between respective conductors therein. The interconnection element 160 may support the second microelectronic element above the major surface 114 of the substrate.

As further seen in FIG. 2, component 150 may partially overlie the rear surface 128 of the first microelectronic element in addition to, or as an alternative to, second microelectronic component 142. Similar to the second microelectronic element 142, component 150 may be electrically coupled with the substrate contacts 124 through the electrically conductive interconnects 125 which extend through the first microelectronic element. Component 150 may comprise one or more active or passive electronic components. In one embodiment, the additional component can be a third microelectronic element which comprises a memory storage array and may have a function such as that described above for the second microelectronic element 142. Additional electrical interconnection between component 150 and substrate contacts 124 can be provided through electrically conductive structure disposed entirely beyond another edge surface 121 of the first microelectronic element, which in one example, may be disposed opposite from the edge surface 119. The component may have third contacts 154 at its front surface 156 facing the rear surface 128 of the first microelectronic element, the third contacts 154 electrically coupled with the substrate contacts 124 through the interconnects 125 which extend through the first microelectronic element 112. In certain implementations, component 150 may comprise plural discrete device components provided in a side-by-side or stacked arrangement, such as a vertically integrated stack of memory chips, sensors, etc.

In the example seen in FIG. 2, electrical interconnection between the component 150 and the substrate 102 can additionally or alternatively be provided through an interconnection element 170 which may be similar to the interconnection element 160 described above, at least portions of the interconnection element disposed between the surface 114 of the substrate and a surface 156 of the component which faces the substrate. In some cases, interconnection element 170 is a portion of a unitary interconnection element which also includes the interconnection element 160. In one embodiment, the interconnection element 170 may fully or partially surround an area of the first microelectronic element 112. In other implementations, elements 160 and/or 170 may be one or more non-conducting spacer elements that provide support for components 142 and/or 150.

FIG. 2 further depicts a heat spreader 132 overlying the rear surface 128 of the first microelectronic element 112 and thermally coupled to a portion of the rear surface 128 that is uncovered by the second microelectronic element 142. The heat spreader may include a thermally conductive material, for example, of metal, semiconducting material having relatively high heat transfer efficiency, composite material which includes such metal or semiconducting material, or other thermally conductive path to remove heat from the underlying components. As seen in FIG. 2, the heat spreader 132 can be thermally coupled to the portion of the rear surface through an interposed thermally conductive spacer 134 and other thermally conductive material 136 such as solder, thermally conductive adhesive, e.g., a polymeric or inorganic adhesive or solder, or a thermally conductive grease, among others. A portion of the heat spreader 132 may overlie a rear surface 148 of the second microelectronic element 142 and be thermally coupled through a similar thermally conductive material with the rear surface of the second microelectronic element.

In a variation of the embodiment seen in FIG. 2, the interconnects 164 need not extend straight through the interconnection element 160, but can be oriented on a slant or include jogs, etc. Moreover, while the pitch between adjacent contacts on either side of element 160 and on either side of element 170 is shown as being the same, such need not be the case and different pitches may be accommodated in order to translate from a finer pitch to a coarser pitch or vice versa.

Figure 3:
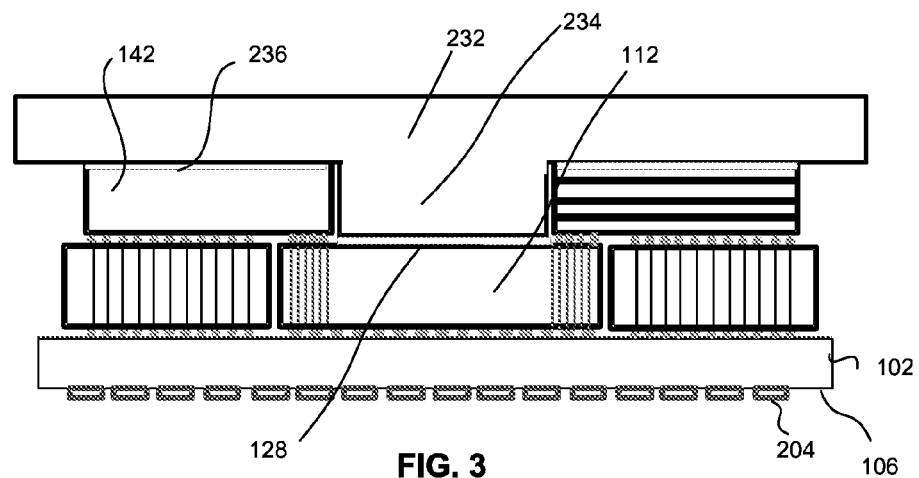
FIG. 3 is a sectional view depicting a microelectronic assembly in accordance with an embodiment of the invention.

As seen in FIG. 3, in one variation, the heat spreader 232 can be a unitary thermally conductive element such as a machined or otherwise patterned metal or semiconducting structure, wherein a part 234 of the heat spreader is disposed adjacent the rear surface 128 of the first microelectronic element 112, such part 234 protruding beyond a surface 236 of the heat spreader that overlies the second microelectronic element 142, wherein the protruding part 234 is thermally coupled with the rear surface 128 through a thermally conductive material such as described above.

FIG. 3 illustrates another possible variation in which the package therein can be provided with electrically conductive terminals 204 at the surface 106 of the substrate. In one example, the terminals 204 can provide a "land grid array" ("LGA") which awaits attachment with a circuit panel such as through an electrically conductive bond material to be applied to the terminals.

Figure 4:
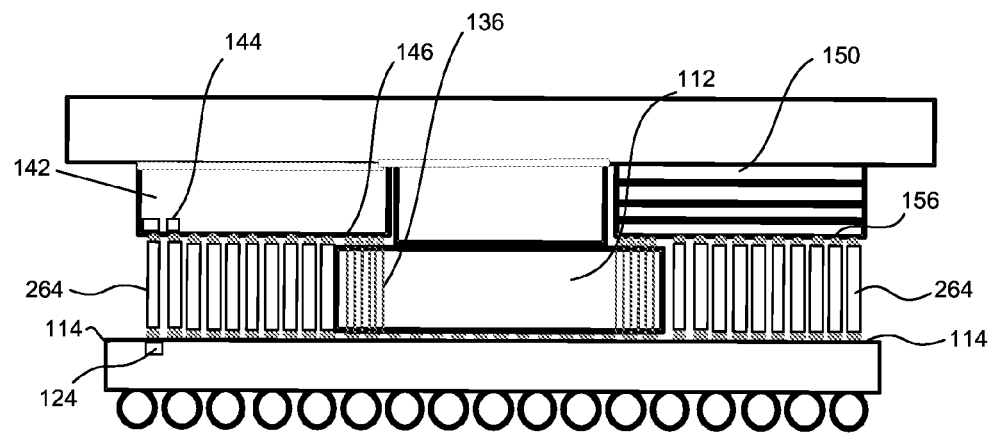
FIG. 4 is a sectional view depicting a microelectronic assembly in accordance with an embodiment of the invention.

FIG. 4 illustrates another variation of the embodiment described above relative to FIG. 2, in which electrical connection between portions of the second microelectronic element 142 and the substrate contacts 124 are provided by individual electrically conductive elements 264 extending in a direction between the front surface 146 of the second microelectronic element 142 and the major surface 114 of the substrate. In one embodiment, the columnar elements 264 can be substantially rigid metal posts, e.g., posts made of copper or nickel or a combination thereof, the posts being formed by additive process such as plating, subtractive process such as etching, or by placing and metallurgically joining pre-formed electrically conductive posts to the contacts at the front surface of the second microelectronic element, on the contacts of the major surface 114 of the substrate, or by providing such posts projecting in a direction away from each of the surfaces 114 and 146. In a particular example, the columnar elements 264 can be provided on the second microelectronic element before placing and electrically coupling contacts 144 at the front surface 146 of the second microelectronic element 142 with the first microelectronic element 112 thereby coupling the contacts 144 with the interconnects 125 extending through the first microelectronic element.

In a particular example of the embodiment of FIG. 4, the columnar elements 264 can be provided as interconnects formed of extruded metal wire. For example, a wirebonding tool can be used to form wire bonds extending upwardly from the contacts 144 at the front surface 146 of the second microelectronic element 142. Prior to coupling the thus formed wire bonds with the corresponding substrate contacts, a dielectric region can be formed which covers most of or an entire height of each wire bond, but leaving tips of the wire bonds exposed and unencapsulated to permit electrical interconnection with another component. The wire bonds extending from the second microelectronic element then are aligned with respective substrate contacts 124 at the surface 114 of the substrate and then joined thereto with a bonding material.

Alternatively, wire bonds can be formed extending upwardly from the substrate contacts 124. Prior to coupling the thus formed wire bonds with the corresponding substrate contacts, a dielectric region can be formed which covers most of or an entire height of each wire bond, but leaving tips of the wire bonds exposed and unencapsulated to permit electrical interconnection with the contacts 144 at the front surface 146 of the second microelectronic component. The wire bonds extending from the substrate then are aligned with the respective contacts 144 of the second microelectronic component and then joined thereto with a bonding material.

The same processes for providing electrical interconnections through columnar elements 264 as described in any of the examples above can be used to provide electrical interconnections through columnar elements 264 extending between a substrate-facing surface 156 of the additional component 150 and the major surface 114 of the substrate 102.

In a variation of the embodiment seen in FIG. 4, instead of wire bonds being columnar in shape, the wire bonds can include jogs or can extend at a slant between the contacts 146 of the second microelectronic element and the substrate contacts 124. Moreover, while the pitch between adjacent contacts is shown as being the same between contacts 124 and 146, such need not be the case and different pitches may be accommodated in order to translate from a finer pitch to a coarser pitch, or vice versa.

Figure 5:
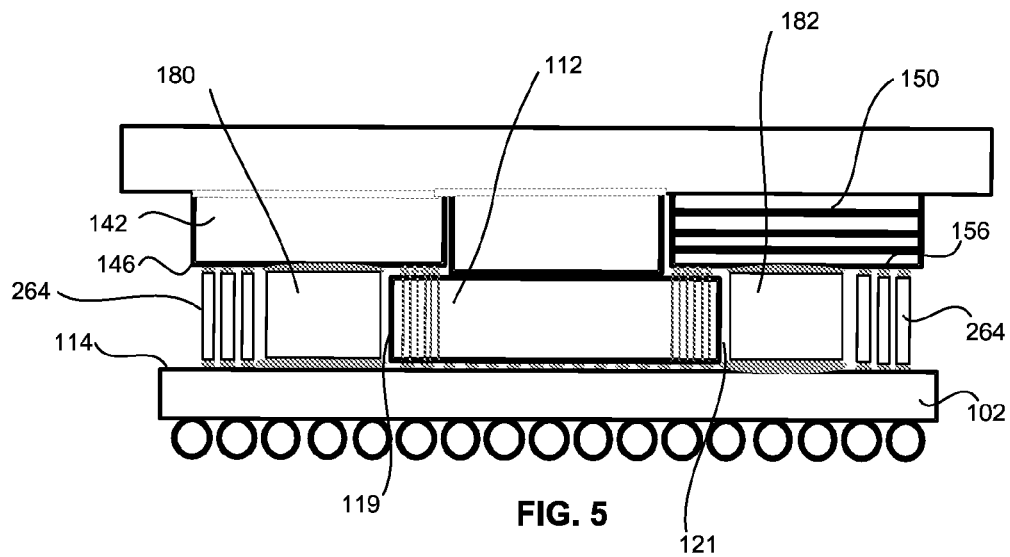
FIG. 5 is a sectional view depicting a microelectronic assembly in accordance with an embodiment of the invention.

FIG. 5 illustrates another example in which additional elements 180, 182 are provided between the substrate major surface 114 and the front surface 146 of the second microelectronic element and between the substrate major surface 114 and the surface 156 of the component 150. In one example, the additional elements can be spacer elements used for mechanical support. The spacer elements may comprise a unitary region of semiconductor material or glass which has surfaces parallel to the first surface of the substrate and the front surface 146 of the second microelectronic element, the spacer element mechanically coupling the substrate with the second microelectronic element.

In another example, one or more of the additional elements 180, 182 comprises active or passive electronic devices or a combination thereof. The elements 180, 182 can be positioned between columnar elements 264 and corresponding edge surfaces 119, 121 of the first microelectronic element as shown in FIG. 5. Alternatively, some or all columnar elements 264 can be positioned between corresponding edge surfaces 119, 121 of the first microelectronic element and the additional elements 180, 182.

Figure 6:
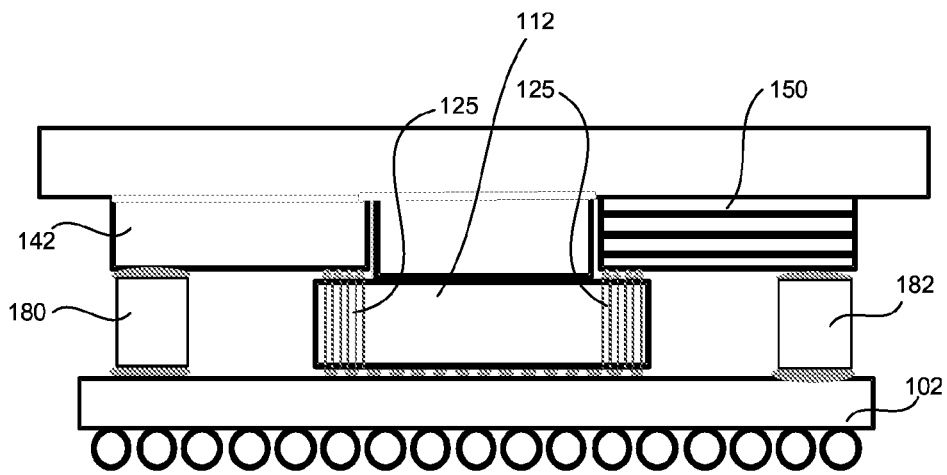
FIG. 6 is a sectional view depicting a microelectronic assembly in accordance with an embodiment of the invention.

In another example seen in FIG. 6, electrical interconnection between the second microelectronic element 142 and the substrate 102 can be provided entirely by the interconnects 125 which extend through the first microelectronic element 112. Additional elements 180, 182 may be provided for mechanical support or to couple passive or active electronic components with the second microelectronic element 142. The same arrangement can be provided for electrical interconnection between the component 150 and the substrate 102.

Figure 7:
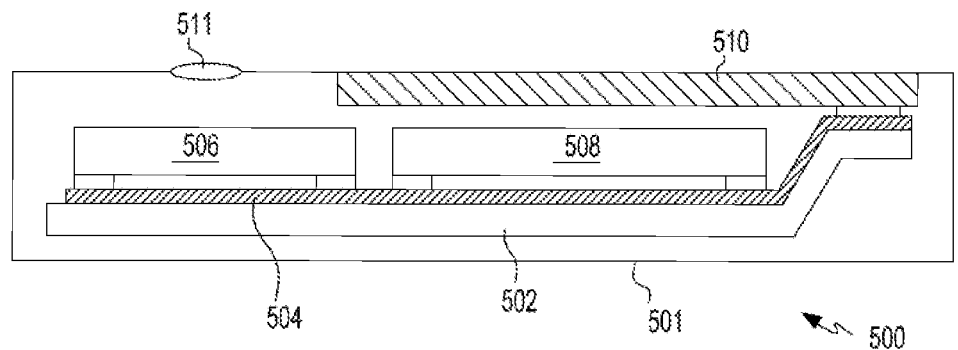
FIG. 7 is a sectional view depicting a system in accordance with an embodiment of the invention.

The microelectronic packages and assemblies described above with reference to FIGS. 2-6 can be utilized in construction of diverse electronic systems, such as the system 500 shown in FIG. 7. In specific examples and without limitation, a system may be a tablet, smartphone, other mobile device, or notebook or laptop computer or other type of processor-implemented device or computer. For example, the system 500 in accordance with a further embodiment of the invention may include one or more microelectronic packages or assemblies as described above in conjunction with other electronic components 508 and 510.

In the exemplary system 500 shown, the system can include a circuit panel, motherboard, or riser panel 502 such as a flexible printed circuit board, and the circuit panel can include numerous conductors 504, of which only one is depicted in FIG. 7, interconnecting the modules or components 506 with one another. Such a circuit panel 502 can transport signals to and from each of the microelectronic packages and/or microelectronic assemblies included in the system 500. However, this is merely exemplary; any suitable structure for making electrical connections between the modules or components 506 can be used.

In a particular embodiment, the system 500 can also include another component such as the semiconductor chip 508, and component 510 which may be a display screen, but any other components can be used in the system 500. Of course, although only two additional components 508 and 510 are depicted in FIG. 7 for clarity of illustration, the system 500 can include any number of such components.

Modules or components 506 and components 508 and 510 can be mounted in a common housing 501, schematically depicted in broken lines, and can be electrically interconnected with one another as necessary to form the desired circuit. The housing 501 is depicted as a portable housing of the type usable, for example, in a smartphone or cellular telephone and screen 510 can be exposed at the surface of the housing. In embodiments where a microelectronic package 506 includes a light-sensitive element such as an imaging chip, a lens 511 or other optical device also can be provided for routing light to the structure. Again, the simplified system shown in FIG. 7 is merely exemplary; other systems, including systems commonly regarded as fixed structures, such as desktop computers, routers and the like can be made using the structures discussed above.

Although not specifically shown in the Figures or particularly described in the foregoing, elements in the various Figures and various described embodiments can be combined together in additional variations of the invention.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A microelectronic package, comprising:
a substrate having first and second oppositely-facing surfaces, a plurality of substrate contacts at the first surface and a plurality of terminals at the second surface;
a first microelectronic element having a front surface and first contacts at its front surface, a rear surface opposite the front surface, a semiconductor region between the front and rear surfaces, and electrically conductive interconnects extending through the semiconductor region in a direction from the rear surface to the front surface, the first contacts facing and joined with the substrate contacts;
a second microelectronic element having a front surface and second contacts at its front surface, the front surface and the second contacts of the second microelectronic element partially overlying the rear surface of the first microelectronic element,
wherein the second contacts are electrically coupled with the substrate contacts through the interconnects, and
at least a portion of the rear surface of the first microelectronic element is uncovered by the second microelectronic element.

2. The microelectronic package as claimed in claim 1, wherein the first microelectronic element has an edge surface extending between its front surface and the rear surface, wherein a portion of the second microelectronic element extends in a lateral direction parallel to the rear surface beyond the edge surface of the first microelectronic element.

3. The microelectronic package as claimed in claim 2, wherein the first microelectronic element comprises logic circuitry and the second microelectronic element comprises a memory storage array, wherein the first and second microelectronic elements are coupled with one another such that the first microelectronic element is configured to post read commands to the second microelectronic element and to receive information retrieved from the memory storage array, and is configured to post write commands to the second microelectronic element and to cause information to be written to the memory storage array.

4. The microelectronic package as claimed in claim 3, wherein the second contacts at a portion of the front surface of the second microelectronic element extending beyond the edge surface of the first microelectronic element are electrically coupled with the substrate contacts through electrically conductive structure disposed entirely beyond the edge surface of the first microelectronic element.

5. The microelectronic package as claimed in claim 4, further comprising a third microelectronic element having a front surface facing the rear surface of the first microelectronic element, the third microelectronic element having third contacts at its front surface facing the rear surface of first microelectronic element, the third contacts electrically coupled with the substrate contacts through the interconnects.

6. The microelectronic package as claimed in claim 4, further comprising an interconnection element disposed beyond the edge surface of the first microelectronic element supporting the second microelectronic element above the first surface of the substrate, wherein the electrically conductive structure extends through the interconnection element.

7. The microelectronic package as claimed in claim 6, wherein the electrically conductive structure comprises at least one of substantially rigid metal posts, or extruded metal wire.

8. The microelectronic package as claimed in claim 6, wherein the interconnection element comprises a region of at least one of glass or semiconductor material, wherein the electrically conductive structure extends through the interconnection element.

9. The microelectronic package as claimed in claim 2, further comprising a heat spreader thermally coupled with the portion of the rear surface that is uncovered by the second microelectronic element.

10. The microelectronic package as claimed in claim 9, wherein the second microelectronic element has a rear surface opposite its front surface, and a portion of the unitary thermally conductive element overlies the rear surface of the second microelectronic element and is thermally coupled therewith.

11. The microelectronic package as claimed in claim 10, wherein the heat spreader comprises a unitary thermally conductive element thermally coupled with the portion of the area of the rear surface of first microelectronic element that is uncovered by the second microelectronic element.

12. The microelectronic package as claimed in claim 2, further comprising a spacer element comprising a unitary region of semiconductor material having surfaces parallel to the first surface of the substrate and the front surface of the second microelectronic element, the spacer element mechanically coupling the substrate with the second microelectronic element.

13. A system comprising the microelectronic package according to claim 1 and one or more other electronic components electrically coupled with the microelectronic package.

14. The system as claimed in claim 13, further comprising a housing, the microelectronic package and the one or more other electronic components being assembled with the housing.

15. A microelectronic package, comprising:
- a substrate having first and second oppositely-facing surfaces, a plurality of substrate contacts at the first surface and a plurality of terminals at the second surface;
- a first microelectronic element consisting essentially of logic circuitry, and having a front surface and first contacts at its front surface, a rear surface opposite the front surface, and an edge surface between the front and rear surfaces, and electrically conductive interconnects extending in a direction from the rear surface to the front surface, the first contacts facing and joined with the substrate contacts;
- a second microelectronic element comprising a memory storage array, and having a front surface and second contacts at its front surface, the front surface and the second contacts of the second microelectronic element partially overlying the rear surface of the first microelectronic element and the front surface extending outwardly beyond the edge surface of the first microelectronic element, wherein the second contacts are electrically coupled with the substrate contacts through the interconnects, and
- the first and second microelectronic elements coupled with one another such that the first microelectronic element is configured to post read commands to the second microelectronic element and to receive information retrieved from the memory storage array, and is configured to post write commands to the second microelectronic element and to cause information to be written to the memory storage array,
- wherein at least a portion of the rear surface of the first microelectronic element is uncovered by the second microelectronic element,
- the microelectronic package further comprising a heat spreader thermally coupled with the portion of the rear surface uncovered by the second microelectronic element.

16. The microelectronic package as claimed in claim 15, wherein the second microelectronic element has a rear surface opposite its front surface, and a portion of the unitary thermally conductive element overlies the rear surface of the second microelectronic element and is thermally coupled therewith.

17. The microelectronic package as claimed in claim 16, further comprising an electrically insulating interconnection element disposed beyond the edge surface of the first microelectronic element supporting the second microelectronic element above the first surface of the substrate, wherein the electrically conductive structure extends through the interconnection element.

18. The microelectronic package as claimed in claim 17, wherein the second contacts at a portion of the front surface of the second microelectronic element extending beyond the edge surface of the first microelectronic element are electrically coupled with the substrate contacts through electrically conductive structure disposed entirely beyond the edge surface of the first microelectronic element.

19. The microelectronic package as claimed in claim 18, wherein the electrically conductive structure comprises substantially rigid metal posts.

20. The microelectronic package as claimed in claim 15, wherein the first microelectronic element has a semiconductor region between the front and rear surfaces, and the electrically conductive interconnects extend through the semiconductor region.

* * * * *